United States Patent
Beatty

(10) Patent No.: US 9,389,292 B2
(45) Date of Patent: Jul. 12, 2016

(54) EFFICIENT METHOD FOR PERFORMING K-SPACE CHANNEL COMBINATION FOR NON-CARTESIAN MRI ACQUISITIONS

(71) Applicant: Philip James Beatty, Thornhill (CA)

(72) Inventor: Philip James Beatty, Thornhill (CA)

(73) Assignee: SUNNYBROOK RESEARCH INSTITUTE, Ontario (CA)

(*) Notice: Subject to any disclaimer, the term of this patent is extended or adjusted under 35 U.S.C. 154(b) by 0 days.

(21) Appl. No.: 14/501,323

(22) Filed: Sep. 30, 2014

(65) Prior Publication Data

US 2015/0093006 A1    Apr. 2, 2015

Related U.S. Application Data

(60) Provisional application No. 61/884,242, filed on Sep. 30, 2013.

(51) Int. Cl.
*G01R 33/561* (2006.01)
*G01R 33/48* (2006.01)

(52) U.S. Cl.
CPC ........ *G01R 33/5611* (2013.01); *G01R 33/4824* (2013.01)

(58) Field of Classification Search
CPC ............. G01R 33/5611; G01R 33/246; G01R 33/385; G01R 33/4824; G06T 11/003; G06T 2207/10088; G01V 3/32
See application file for complete search history.

(56) References Cited

U.S. PATENT DOCUMENTS

| | | | | |
|---|---|---|---|---|
| 6,853,191 B1* | 2/2005 | Miller et al. | | 324/309 |
| 6,903,551 B2* | 6/2005 | Madore | | 324/309 |
| 7,132,827 B2* | 11/2006 | Griswold et al. | | 324/309 |
| 7,348,776 B1* | 3/2008 | Aksoy et al. | | 324/307 |
| 7,439,739 B2* | 10/2008 | Beatty | | 324/309 |
| 7,583,082 B1* | 9/2009 | Hu et al. | | 324/309 |
| 8,026,720 B1* | 9/2011 | Chen et al. | | 324/309 |
| 8,076,938 B2* | 12/2011 | Brau et al. | | 324/309 |
| 8,901,927 B2* | 12/2014 | Gross | | 324/309 |
| 2004/0152969 A1* | 8/2004 | Zhang et al. | | 600/422 |
| 2013/0088225 A1* | 4/2013 | Weller et al. | | 324/307 |
| 2013/0289912 A1* | 10/2013 | Liu et al. | | 702/65 |

OTHER PUBLICATIONS

Beatty et al. Design of k-space Channel combination Kernes and Itegration with Parallel imaging. Aug. 13, 2013, wileyonlinelibrary.com.*

* cited by examiner

*Primary Examiner* — Jingge Wu
(74) *Attorney, Agent, or Firm* — Quarles & Brady, LLP

(57) ABSTRACT

A system and method for combining k-space data acquired on multiple different receiver channels in a multichannel receiver is provided. One or more convolution kernels are used to combine the k-space data. Each convolution kernel is designed as the combination of one or more channel combination kernels and an alias-suppressing kernel. The channel combination kernels are designed to have a smaller sample spacing than the acquired data, and the alias-suppressing kernel is designed to suppress aliasing artifacts in stopbands defined by the sample spacing of the channel combination kernels.

19 Claims, 4 Drawing Sheets

EFFICIENT METHOD FOR PERFORMING K-SPACE CHANNEL COMBINATION FOR NON-CARTESIAN MRI ACQUISITIONS

CROSS-REFERENCE TO RELATED APPLICATIONS

This application claims the benefit of U.S. Provisional Patent Application Ser. No. 61/884,242, filed on Sep. 30, 2013, and entitled "AN EFFICIENT METHOD FOR PERFORMING K-SPACE CHANNEL COMBINATION FOR NON-CARTESIAN MRI ACQUISITIONS."

BACKGROUND OF THE INVENTION

The field of the invention is systems and methods for magnetic resonance imaging ("MRI"). More particularly, the invention relates to systems and methods for combining k-space data acquired from multiple different receiver channels during image reconstruction.

Over the past decade, multichannel receiver arrays have revolutionized MRI by improving the achievable signal-to-noise ratio ("SNR") and providing spatial encoding information complimentary to traditional gradient encoding. These technical advantages have been leveraged across a variety of applications to reduce scan time, improve spatial and/or temporal resolution, increase coverage, or reduce certain types of artifacts, such as those associated with motion and geometric distortion.

Even as multichannel receiver technology has been a clear success story, it is not without cost. For instance, multi-element anatomy-specific coil arrays are expensive to develop and manufacture, and a greater burden is placed on image reconstruction systems, which can struggle to process the increased amount of data within acceptable latency times for clinical applications.

Maintaining acceptable reconstruction latency can be challenging when using a high number of receiver channels. For real-time imaging, images must be acquired and reconstructed with minimal latency, which has led to recent interest in k-space channel combination using rapid non-Cartesian acquisitions. Channel combination of k-space data reduces reconstruction latency because memory requirements are reduced such that even large multichannel 3D datasets can be gridded during data acquisition, channel combination can take place during image acquisition, and the number of Fourier transforms required to transform the data to image space is reduced from the number of channels to one.

It would therefore be desirable to provide a system and method for lessening the computational burden required to reconstruct images from multichannel data. It would also be desirable to achieve this results for data acquired using non-Cartesian k-space trajectories. While the vast majority of clinical MRI is currently performed using Cartesian k-space trajectories, non-Cartesian MRI can be advantageous for applications such as ultra-fast imaging, motion correction, ultra-short echo time imaging, and certain types of dynamic imaging.

Reconstruction of multichannel non-Cartesian data sets is typically performed by reconstructing a separate image for each acquisition channel, followed by combining these images to form a single composite image. For example, a gridding reconstruction can be applied to reconstruct separate channel images followed by a sum-of-squares channel combination.

In 2011, the feasibility of combining "direct virtual coil" (DVC) technology with a gridding reconstruction to enable multi-channel data to be gridded (deposited) onto a single k-space grid was demonstrated by P. J. Beatty, et al., in "k-Space Channel Combination for Non-Cartesian Acquisitions Using Direct Virtual Coil (DVC) Calibration," *Proc. of ISMRM,* 2011; 2858. This technique effectively combined multichannel data in k-space earlier in the reconstruction process. FIG. 1 illustrates an example of this previous approach for combining multichannel k-space data.

A standard Kaiser-Bessel gridding kernel 106 is generated with a kernel width of 4 and an oversampling ratio of 1.5., and a DVC kernel 104 is generated, also for an oversampling ratio of 1.5. Because the discrete samples of these two kernels align on the same 1.5× grid, they can be discretely convolved to form a final convolution kernel 102. The Kaiser-Bessel kernel is applied directly to the k-space acquisition position and sampled according to the final grid spacing. This dictates that the DVC kernel must also be created with final grid spacing. When the two kernels are convolved together, the result is a larger kernel (width 8 in this case). As illustrated in FIG. 2, in the approach proposed in 2011, the purpose of the DVC filter 202 (Fourier Transform of the DVC kernel) is to create a pass band 204 that mimics the conjugate of the coil sensitivity. The Kaiser-Bessel filter 206 is then responsible for suppressing content in the stopbands 208, just as in traditional gridding.

This DVC approach significantly reduces the amount of computer memory required for data combination and reconstruction. For instance, rather than requiring a grid matrix for every channel, only one grid matrix is required, regardless of channel count. This advantage is especially notable for large 3D acquisitions, where a grid matrix for all channels cannot be simultaneously stored in RAM memory; in this case, the reconstruction latency is greatly increased when reconstructing separate channel images. Additionally, only one grid matrix needs to be Fourier transformed and all subsequent reconstruction processes take place on only a single channel matrix, thereby reducing the required computation.

Notwithstanding these advantages, there is a problem with the approach proposed in 2011. In particular, the approach results in a larger convolution kernel compared to the traditional gridding approach. Specifically, for 2D image reconstructions, an 8×8 convolution kernel was required by the DVC approach to achieve image quality comparable to a 4×4 kernel used with traditional gridding. The additional computation required by the larger convolution kernel can significantly add to the time and computational burden for reconstruction.

SUMMARY OF THE INVENTION

The present invention overcomes the aforementioned drawbacks by providing a method for combining k-space measurements made on a plurality of different receiver channels in a multichannel receiver that forms a part of a magnetic resonance imaging ("MRI") system. The MRI system is directed to acquire a k-space data set for a plurality of different receiver channels in the multichannel receiver. At least one convolution kernel is then formed by combining at least one coil combination kernel having a sample spacing smaller than a sample spacing in the acquired k-space data sets and an alias-suppressing kernel that is designed based on the sample spacing of the coil combination kernels. Channel combined data is produced by applying the one or more convolution kernels to the acquired k-space data sets, and an image is reconstructed from the channel combined data.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A system and method for combining k-space data acquired on multiple different receiver channels is provided. At least one convolution kernel is used to combine the k-space data. The convolution kernels are designed as the combination of a channel combination kernel and an alias-suppressing kernel. Using the system and method of the present invention, it is possible to retain comparable image quality to prior methods, but while using a smaller kernel width than those previous methods. As an example, for 2D and 3D reconstructions, the present invention can obtain similar image quality to previous methods, but with a kernel size that is four and eight times smaller, respectively, compared to previous methods. This decrease in kernel size allows a significant improvement in reconstruction efficiency.

Figure 1:
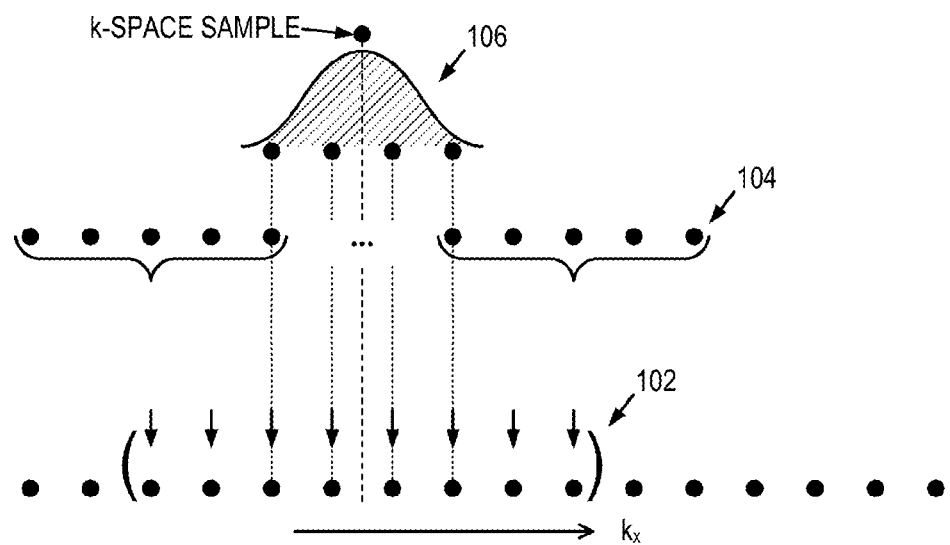
FIG. 1 is an example of a method for combining multichannel k-space data in which a direct virtual coil combination kernel is applied to k-space data after a Kaiser-Bessel alias-suppressing kernel.
Figure 2:
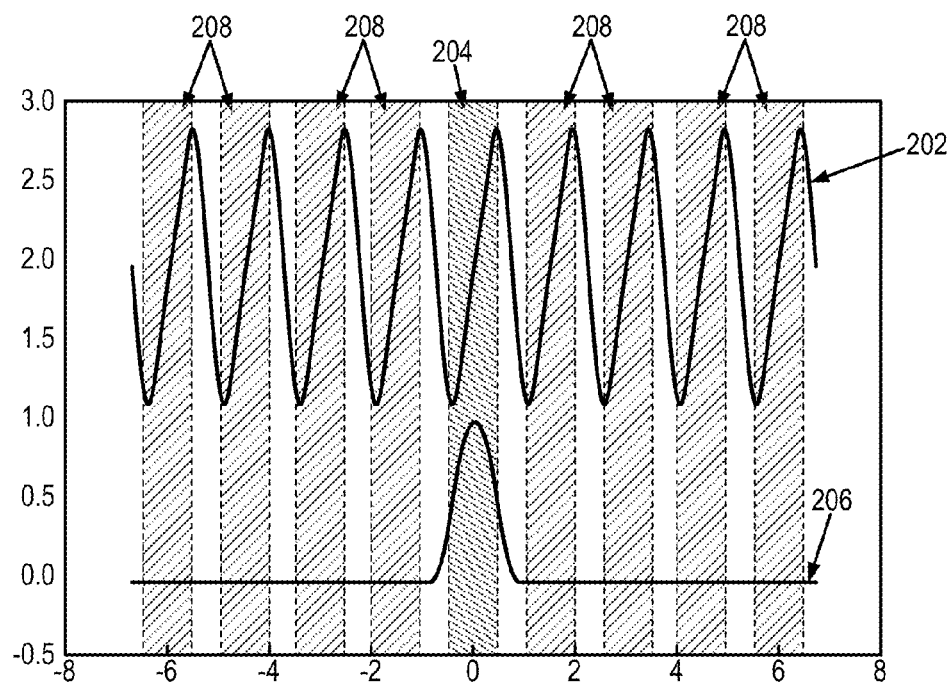
FIG. 2 is an example of a direct virtual coil filter and Kaiser-Bessel filter associated with the kernels of FIG. 1.
Figure 3:
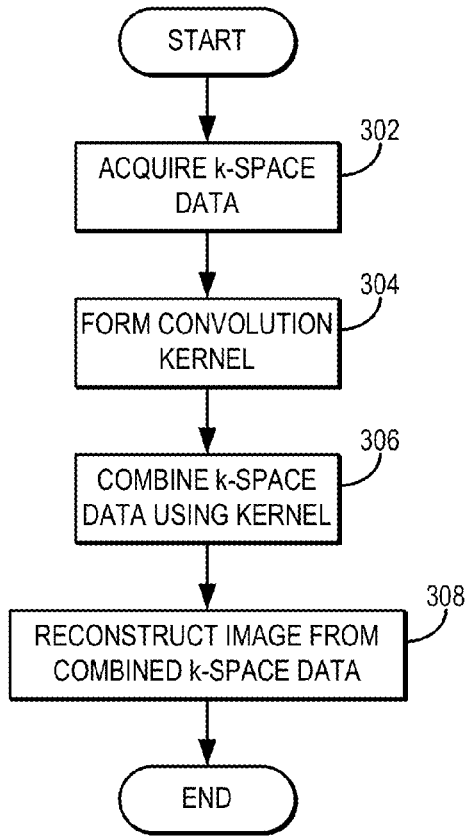
FIG. 3 is a flowchart setting forth the steps of an example method for combining multichannel k-space data in accordance with some embodiments of the present invention.

Referring now to FIG. 3, a flowchart setting forth the steps of an example of a method for combining k-space data from multiple different receiver channels is illustrated. First, data is acquired with a magnetic resonance imaging ("MRI") system, as illustrated at step 302. In some embodiments, data is acquired on each of the different receiver channels in the multichannel receiver. For example, a 16 channel receiver may be used to acquire data from each of 16 different RF coils in an RF coil array. In other embodiments, a subset of the available number of receiver channels may be used to acquired data. For example, a 16 channel breast RF coil can be used together with a 32 channel receiver, and if only one breast is imaged at a time, then data may only be acquired on 8 channels of the receiver.

Figure 4:
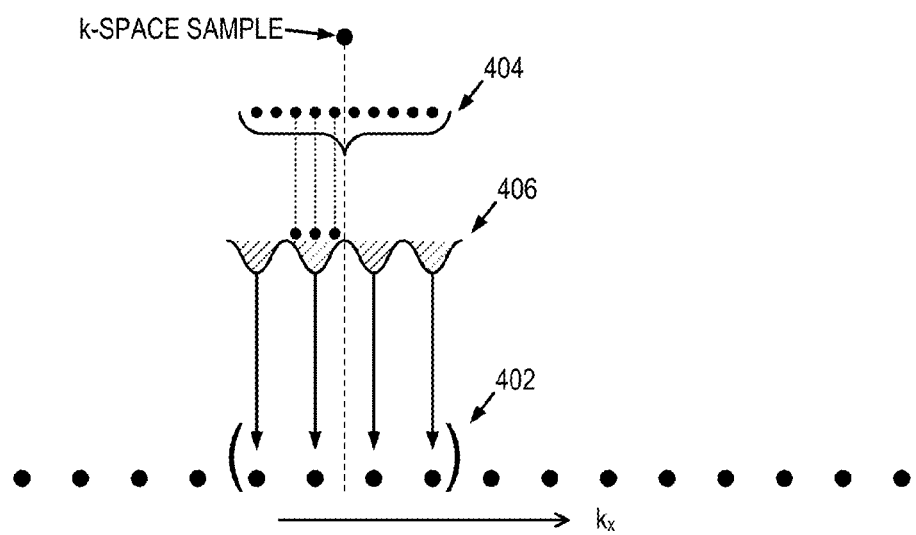
FIG. 4 is an example of a method for combing multichannel k-space data in accordance with some embodiments of the present invention.

At least one convolution kernel is then formed, as indicated at step 304. Typically, one convolution kernel will be generated for each receiver channel that was used to acquire data. In other embodiments, however, multiple convolution kernels can be generated for one or more receiver channels. Thus, in general, at least one convolution kernel is generated for each channel, but it is also possible to generate more than one convolution kernel for any given receiver channel. Generally, as illustrated in FIG. 4, the convolution kernel 402 includes a channel combination kernel 404 and an alias-suppressing kernel 406 that are combined, such as by convolution. As will be described below in detail, the technical motivation for the present invention can be appreciated by viewing the Fourier transforms of the kernel elements 404, 406 in image space, where they act as filters. Ideally, the Fourier transform of the convolution kernel 402 should mimic the conjugate of the coil sensitivity in the passband, while being zero in all stopbands.

The channel combination kernel 404 may be a discretely defined non-separable channel combination kernel. Generally, the channel combination kernel 404 is designed to have a sample spacing that is smaller than the k-space sample spacing in the acquired data. By way of example, the sample spacing in the channel combination kernel may be three times smaller than the k-space sample spacing in the acquired data. The channel combination kernel can also be designed to suppress aliasing in one or more stopbands.

Figure 5A:
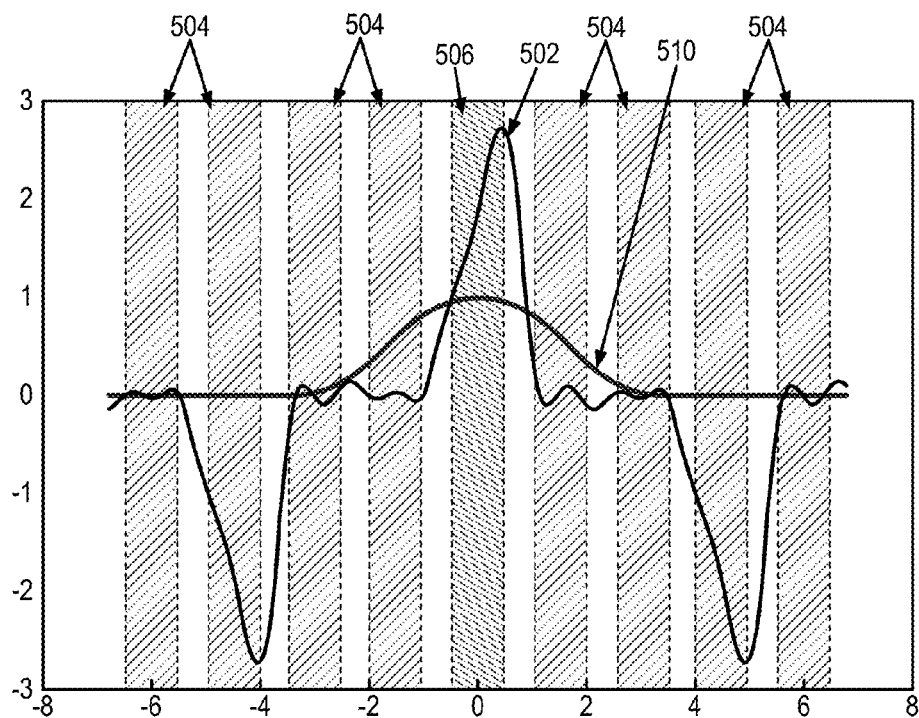
FIG. 5A is an example of an image space representation of a convolution kernel computed in accordance with some embodiments of the present invention.

Thus, the channel combination kernel is designed such that it defines a channel combination filter that mimics the conjugate of the receive coil sensitivity in the pass band and targets a zero value across a specified number of stop bands. An example of such a channel combination filter is illustrated in FIG. 5A. The channel combination kernel associated with this example filter 502 was designed to be zero across two stopbands 504 on either side of the passband 506. To enable the channel combination filter 502 to meet these constraints, the smaller k-space sampling discussed above is used. This design consideration allows an additional performance improvement. Here, the channel combination kernel has repetition every 4.5 times the field-of-view and the alias-suppressing convolution kernel is designed to suppress aliased copies from the third stop band outward.

Because it is known that the channel combination filter will target zero values in the stopbands, the passband target can be pre-apodized in a similar manner to that performed by a traditional gridding kernel. An example of such a pre-apodized channel combination filter 508 is illustrated in FIG. 5B.

By way of example, the channel combination kernel can be computed using a direct virtual coil ("DVC") technique, such as the one described in co-pending U.S. Pat. No. 8,076,938, which is herein incorporated by reference in its entirety. Generally, the DVC calibration algorithm uses low resolution multichannel data to estimate the magnitude and phase of a "virtual coil" image, and then uses a least-squares fitting between the multichannel data and virtual coil data to generate a channel combination kernel. To estimate the virtual coil phase, DVC uses an overlapping tile-based algorithm that has been shown to work with out-of-phase acquisitions and challenging coil geometries.

The alias-suppressing kernel may be a continuously defined separable alias-suppressing kernel for suppressing aliasing artifacts in the acquired k-space data. By way of example, the alias-suppressing kernel may be a Kaiser-Bessel kernel. The alias-suppressing kernel is designed to have a width and oversampling ratio relative to the sample spacing of the channel combination kernel. The alias-suppressing kernel can thus be viewed as performing an inverse gridding operation from the channel combination kernel onto the final k-space grid.

Figure 5B:
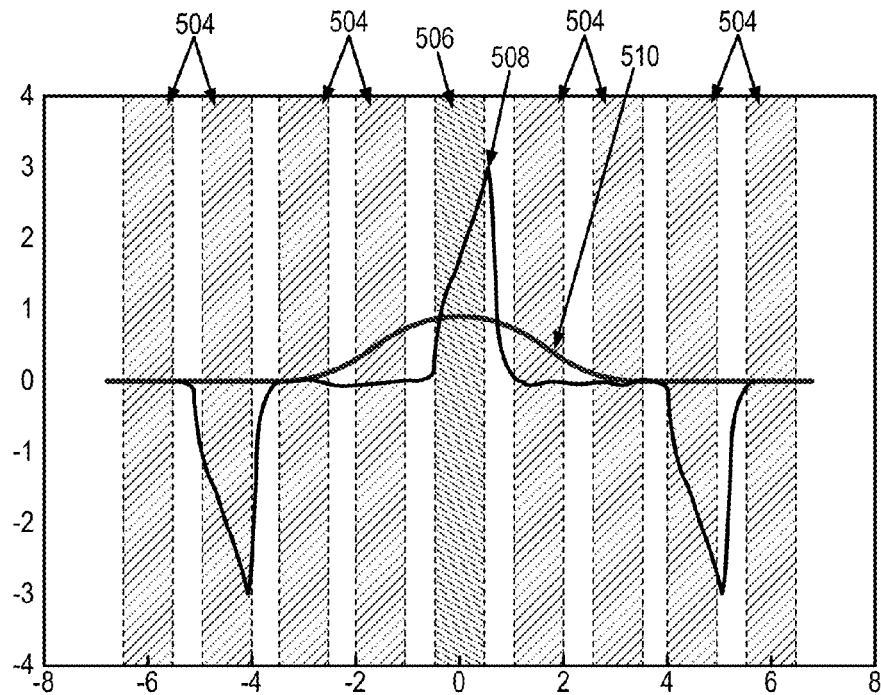
FIG. 5B is an example of image space representation of a pre-apodized convolution kernel computed in accordance with some embodiments of the present invention.

An example of the alias-suppressing filter 510 generated by Fourier transforming the alias-suppressing kernel is illustrated in FIGS. 5A and 5B. Also shown in FIGS. 5A and 5B, because the channel combination kernel suppresses signal over the first several stopbands 504, the alias-suppressing kernel can be designed such that it only suppresses signals in the remaining stopbands. This greatly eases the design of the alias-suppressing kernel and enables the implementation of a much narrower kernel that achievable with previous methods. In the examples illustrated in FIGS. 5A and 5B, a kernel of width 3 on a 4.5 times oversampled channel combination kernel grid was used. This arrangement corresponds to a width 1 kernel on the 1.5 times oversampled grid. Thus, the alias-suppressing kernel adds very little to the final kernel width, thereby reducing the overall computation burden of the channel combination process.

Thus, by way of example, the convolution kernels may be computed as follows. The channel combination kernel may be a DVC kernel designed with smaller k-space sample spacing that is applied to the k-space acquisition position first. An alias-suppressing Kaiser-Bessel kernel is then applied to create the final convolution kernel. In this case, the Kaiser-Bessel kernel is not designed based on the grid sample spacing, but rather on the sample spacing of the DVC kernel, effectively "inverse gridding" the DVC channel combination kernel.

Referring again to FIG. 3, the at least one combined convolution kernel is used to combine the multichannel k-space data, as indicated at step 306. By way of example, the one or more convolution kernels may be used to directly transform the multichannel k-space data, which may be non-Cartesian, to a single Cartesian k-space dataset. In some embodiments, the acquired k-space data can be processed before it is combined. For example, synthesized k-space data can be generated from the acquired k-space data, and the combined convolution kernel applied to at least the synthesized k-space data. In another example, the k-space data can be Fourier transformed along all but one direction. That is, when the k-space data set is an N-dimensional k-space data set, the processing can include Fourier transforming that N-dimensional k-space data set along (N−1) dimensions or fewer. In this approach, hybrid k-space data (e.g., data in a hybrid image space and k-space, such as $\{x,k_y,k_z\}$, $\{k_x,y,k_z\}$, $\{x,k_y\}$, etc.) is formed by the applied Fourier transform or Fourier transforms.

Because the alias-suppressing kernel is typically very finely sampled and the channel combination kernel is generally non-separable, the combined convolution kernel can require a fairly large matrix for storage, making in prohibitive for use in 3D applications. To address this challenge, the channel combination and alias-suppressing kernels can be stored separately and convolved on the fly as the multichannel data is gridded. In this on-the-fly approach, the channel combination kernel is preferably designed with identical point spacing to the oversampled gridding matrix. After the multichannel k-space data has been combined into a single k-space data set, an image is reconstructed from the combined data, as indicated at step 308.

Figure 6:
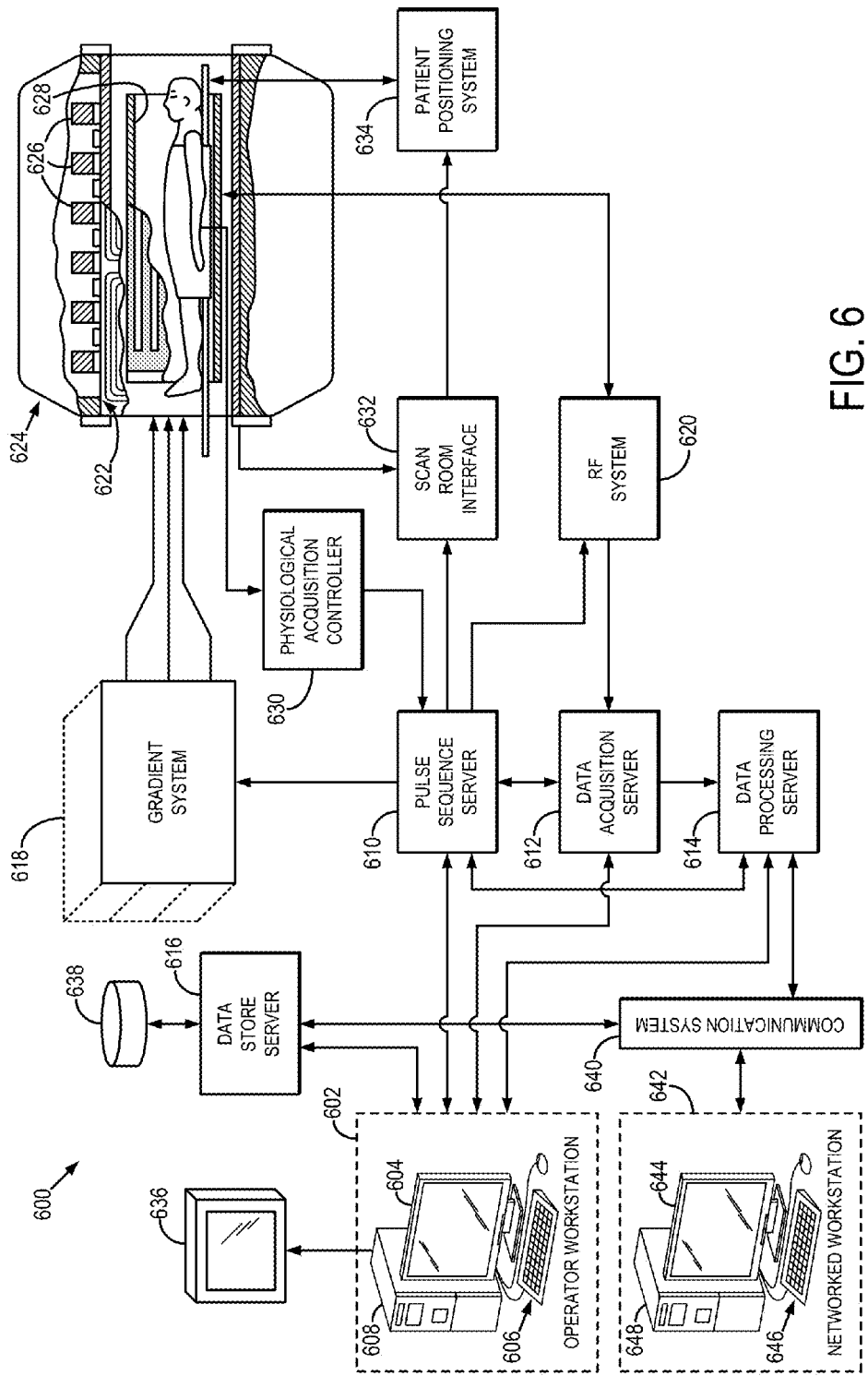
FIG. 6 is a block diagram of an example of a magnetic resonance imaging ("MRI") system.

Referring particularly now to FIG. 6, an example of a magnetic resonance imaging ("MRI") system 600 is illustrated. The MRI system 600 includes a workstation 602 having a display 604 and a keyboard 606. The workstation 602 includes a processor 608, such as a commercially available programmable machine running a commercially available operating system. The workstation 602 provides the operator interface that enables scan prescriptions to be entered into the MRI system 600. The workstation 602 is coupled to four servers: a pulse sequence server 610; a data acquisition server 612; a data processing server 614; and a data store server 616. The workstation 602 and each server 610, 612, 614, and 616 are connected to communicate with each other.

The pulse sequence server 610 functions in response to instructions downloaded from the workstation 602 to operate a gradient system 618 and a radiofrequency ("RF") system 620. Gradient waveforms necessary to perform the prescribed scan are produced and applied to the gradient system 618, which excites gradient coils in an assembly 622 to produce the magnetic field gradients $G_x$, $G_y$, and $G_z$ used for position encoding MR signals. The gradient coil assembly 622 forms part of a magnet assembly 624 that includes a polarizing magnet 626 and a whole-body RF coil 628.

RF excitation waveforms are applied to the RF coil 628, or a separate local coil (not shown in FIG. 6), by the RF system 620 to perform the prescribed magnetic resonance pulse sequence. Responsive MR signals detected by the RF coil 628, or a separate local coil (not shown in FIG. 6), are received by the RF system 620, amplified, demodulated, filtered, and digitized under direction of commands produced by the pulse sequence server 610. The RF system 620 includes an RF transmitter for producing a wide variety of RF pulses used in MR pulse sequences. The RF transmitter is responsive to the scan prescription and direction from the pulse sequence server 610 to produce RF pulses of the desired frequency, phase, and pulse amplitude waveform. The generated RF pulses may be applied to the whole body RF coil 628 or to one or more local coils or coil arrays (not shown in FIG. 6).

The RF system 620 also includes one or more RF receiver channels. Each RF receiver channel includes an RF preamplifier that amplifies the MR signal received by the coil 628 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \tag{1};$$

and the phase of the received MR signal may also be determined:

$$\varphi = \tan^{-1}\left(\frac{Q}{I}\right). \tag{2}$$

The pulse sequence server 610 also optionally receives patient data from a physiological acquisition controller 630. The controller 630 receives signals from a number of different sensors connected to the patient, such as electrocardiograph ("ECG") signals from electrodes, or respiratory signals from a bellows or other respiratory monitoring device. Such signals are typically used by the pulse sequence server 610 to synchronize, or "gate," the performance of the scan with the subject's heart beat or respiration.

The pulse sequence server 610 also connects to a scan room interface circuit 632 that receives signals from various sensors associated with the condition of the patient and the magnet system. It is also through the scan room interface circuit 632 that a patient positioning system 634 receives commands to move the patient to desired positions during the scan.

The digitized MR signal samples produced by the RF system 620 are received by the data acquisition server 612. The data acquisition server 612 operates in response to instructions downloaded from the workstation 602 to receive the real-time MR data and provide buffer storage, such that no data is lost by data overrun. In some scans, the data acquisition server 612 does little more than pass the acquired MR data to the data processor server 614. However, in scans that require information derived from acquired MR data to control the further performance of the scan, the data acquisition server 612 is programmed to produce such information and convey it to the pulse sequence server 610. For example, during prescans, MR data is acquired and used to calibrate the pulse sequence performed by the pulse sequence server 610. Also, navigator signals may be acquired during a scan and used to adjust the operating parameters of the RF system 620 or the gradient system 618, or to control the view order in which k-space is sampled. In all these examples, the data acquisition server 612 acquires MR data and processes it in real-time to produce information that is used to control the scan.

The data processing server 614 receives MR data from the data acquisition server 612 and processes it in accordance with instructions downloaded from the workstation 602. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 614 are conveyed back to the workstation 602 where they are stored. Real-time images are stored in a data base memory cache (not shown in FIG. 6), from which they may be output to operator display 612 or a display 636 that is located near the magnet assembly 624 for use by attending physicians. Batch mode images or selected real time images are stored in a host database on disc storage 638. When such images have been reconstructed and transferred to storage, the data processing server 614 notifies the data store server 616 on the workstation 602. The workstation 602 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for combining k-space measurements made on a plurality of different receiver channels in a multichannel receiver that forms a part of a magnetic resonance imaging (MRI) system, the steps of the method comprising:
   a) directing the MRI system to acquire a k-space data set for a plurality of different receiver channels in the multichannel receiver;
   b) forming at least one convolution kernel by combining:
      i) at least one coil combination kernel having a sample spacing smaller than a sample spacing in the acquired k-space data sets; and
      ii) an alias-suppressing kernel that is designed based on the sample spacing of the at least one coil combination kernel;
   c) generating channel combined data by applying the at least one convolution kernel formed in step b) to the k-space data sets acquired in step a); and
   d) reconstructing an image from the channel combined data generated in step c).

2. The method as recited in claim 1 wherein the at least one coil combination kernel includes a discretely defined non-separable channel combination kernel.

3. The method as recited in claim 1 wherein the at least one coil combination kernel includes a direct virtual coil (DVC) combination kernel.

4. The method as recited in claim 1 wherein the alias-suppressing kernel is a continuously defined separable aliasing-suppressing kernel.

5. The method as recited in claim 1 wherein the alias-suppressing kernel is a Kaiser-Bessel kernel.

6. The method as recited in claim 1 wherein step b) includes convolving the at least one coil combination kernel with the alias-suppressing kernel.

7. The method as recited in claim 1 wherein step a) includes acquiring the k-space data sets by sampling k-space along non-Cartesian k-space trajectories.

8. The method as recited in claim 1 wherein step c) includes processing the k-space data sets acquired in step a) before applying the at least one convolution kernel.

9. The method as recited in claim 8 wherein the processing in step c) includes forming synthesized k-space data sets from the acquired k-space data sets, and wherein step c) includes applying the at least one convolution kernel at least to the synthesized k-space data sets.

10. The method as recited in claim 8 wherein the acquired k-space data sets are N-dimensional k-space data sets and the processing in step c) includes Fourier transforming the acquired k-space data sets along less than N dimensions.

11. The method as recited in claim 1 wherein the plurality of different receiver channels comprises a subset of an available number of receiver channels in the multichannel receiver.

12. A method for reconstructing an image of a subject using a magnetic resonance imaging (MRI) system, the steps of the method comprising:
   a) directing the MRI system to acquire k-space data on a plurality of different receiver channels in a multichannel receiver;
   b) generating combined k-space data by convolving the acquired k-space data with at least one kernel that includes a first kernel component that resamples the k-space data to a finer sample spacing than in the acquired data and a second kernel component that suppresses aliasing in stopbands that are defined by the sample spacing of the first kernel component; and
   c) reconstructing an image from the combined k-space data.

13. The method as recited in claim 12 wherein the first kernel component is a discretely defined non-separable channel combination kernel.

14. The method as recited in claim 12 wherein the first kernel component is a direct virtual coil (DVC) combination kernel.

15. The method as recited in claim 12 wherein the second kernel component is a continuously defined separable aliasing-suppressing kernel.

16. The method as recited in claim 12 wherein the second kernel component is a Kaiser-Bessel kernel.

17. The method as recited in claim 12 wherein step a) includes acquiring the k-space data by sampling k-space along non-Cartesian k-space trajectories.

18. The method as recited in claim 12 wherein the first kernel component comprises a plurality of kernel components that each resample the k-space data to a finer sample spacing than in the acquired data.

19. The method as recited in claim 12 wherein the plurality of different receiver channels comprises a subset of an available number of receiver channels in the multichannel receiver.

* * * * *